United States Patent
An et al.

(10) Patent No.: US 7,064,365 B2
(45) Date of Patent: Jun. 20, 2006

(54) FERROELECTRIC CAPACITORS INCLUDING A SEED CONDUCTIVE FILM

(75) Inventors: Hyeong-Geun An, Gyeonggi-do (KR); Sang-Woo Lee, Seoul (KR); Hyoung-Joon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 181 days.

(21) Appl. No.: 10/705,680

(22) Filed: Nov. 10, 2003

(65) Prior Publication Data

US 2004/0135182 A1 Jul. 15, 2004

(30) Foreign Application Priority Data

Nov. 11, 2002 (KR) .................. 10-2002-0069541

(51) Int. Cl.
*H01L 29/76* (2006.01)
(52) U.S. Cl. .................. 257/295; 438/3; 438/242; 438/386
(58) Field of Classification Search ............... None
See application file for complete search history.

(56) References Cited

U.S. PATENT DOCUMENTS 5,198,994 A 3/1993 Natori ................ 364/145
5,523,964 A 6/1996 McMillan et al. ......... 365/145
6,297,527 B1* 10/2001 Agarwal et al. ............ 257/306
2002/0075736 A1* 6/2002 Kumura et al. ............ 365/200

FOREIGN PATENT DOCUMENTS

KR 000044930 7/2000
KR 010059002 7/2001

OTHER PUBLICATIONS

Notice to Submit Response for corresponding Korean Application No. 10-2002-0069541 dated Sep. 23, 2004 (English Translation).

* cited by examiner

*Primary Examiner*—David Nelms
*Assistant Examiner*—Long Tran
(74) *Attorney, Agent, or Firm*—Myers Bigel Sibley & Sajovec

(57) ABSTRACT

Ferroelectric capacitors include a support insulating film on an integrated circuit substrate and having a trench therein. A lower electrode is on sidewalls and a bottom surface of the trench. A seed conductive film covers the lower electrode. A ferroelectric film is provided on the support insulating film and the seed conductive film and an upper electrode is provided on the ferroelectric film. The lower electrode may fill the trench and the ferroelectric film may extend over all of the seed conductive film and the support insulating film adjacent the seed conductive film.

15 Claims, 9 Drawing Sheets

FERROELECTRIC CAPACITORS INCLUDING A SEED CONDUCTIVE FILM

RELATED APPLICATION

This application claims priority from Korean Application No. 2002-69541, filed Nov. 11, 2002, the disclosure of which is hereby incorporated herein by reference.

BACKGROUND OF THE INVENTION

The present invention relates to integrated circuit devices and, more particularly, to integrated circuit devices, such as memory devices, including a ferroelectric capacitor and methods for manufacturing the same.

Recently, ferroelectric memory devices using ferroelectric layers have been considered as an alternative approach for certain memory applications. Ferroelectric memory devices are generally divided into two categories. The first category includes devices using a ferroelectric capacitor as described, for example, in U.S. Pat. No. 5,523,964. The second category includes devices having a ferroelectric field emission transistor (FET) as described, for example, in U.S. Pat. No. 5,198,994. These devices may provide higher-speed read and write operations and/or lower power consumption than other types of memory devices. For example, these device may have non-volatile memory properties comparable to that of the flash memory, and an operation speed, a low power operation, a low voltage operation, and reliability comparable to those of static random access memory (SRAM) and the like.

Ferroelectric memory devices may be used for non-volatile memory by using their ferroelectric characteristics to retain data when no power is supplied to the device. This non-volatile property of the ferroelectric memory device is based on an inherent property of the ferroelectric material used in the device. The ferroelectric material generally has two stable remnant polarization (Pr) states. The remnant polarization states may be changed by application of an external electric field and the new state is maintained after the external electric field is removed.

Much like the structure of a typically dynamic random access memory (DRAM) capacitor, a ferroelectric capacitor may be used to store data in a memory cell. The ferroelectric capacitor includes a ferroelectric material between the two electrodes. While the DRAM capacitor generally stores data by charging of a capacitor including a dielectric film interposed between two electrodes, the ferroelectric capacitor generally stores data using the remnant polarization of the ferroelectric material interposed between two electrodes.

As the ferroelectric capacitor employs a ferroelectric material rather than a dielectric material, the fabrication process for the ferroelectric capacitor differs from that for a DRAM memory device. For example, because the polysilicon electrode material generally used in a DRAM memory device actively reacts with the ferroelectric material used in a ferroelectric capacitor, a different material may be used for the electrodes. A noble metal, such as platinum (Pt), or a conductive oxide, such as iridium dioxide ($IrO_2$)s, may be used in place of polysilicon as the electrode material of the ferroelectric capacitor.

In a typical ferroelectric capacitor fabrication process, a lower electrode material, a ferroelectric film and an upper electrode material are sequentially deposited on an integrated circuit (semiconductor) substrate and etched to have a predetermined pattern. As an electrode material, such as platinum, is generally not etched to an optimal shape, the resulting ferroelectric capacitor generally has a tilted sidewall profile. In other words, the ferroelectric capacitor has a profile with wider sidewalls in the lower portion than in the upper portion of the capacitor. Such a profile may cause adjacent ferroelectric capacitors to be, undesirably, electrically connected with each other. If the adjacent capacitors are placed farther apart to avoid this problem, the integration density of the integrated circuit device may be reduced. Also, the effective contact area between the ferroelectric film and the electrode may be reduced as a result of the tilted sidewall profile of the ferroelectric capacitor. Furthermore, as the ferroelectric film may be subjected to etch damage during the etching process of the lower electrode, the ferroelectricity of the ferroeletric film may be deteriorated.

SUMMARY OF THE INVENTION

Embodiments of the present invention include ferroelectric capacitors including a support insulating film on an integrated circuit substrate and having a trench therein. A lower electrode is on sidewalls and a bottom surface of the trench. A seed conductive film covers the lower electrode. A ferroelectric film is provided on the support insulating film and the seed conductive film and an upper electrode is provided on the ferroelectric film. The lower electrode may fill the trench and the ferroelectric film may extend over all of the seed conductive film and the support insulating film adjacent the seed conductive film.

In some embodiments of the present invention, the lower electrode includes an upper portion thereof extending from the trench to a height relative to the integrated circuit substrate greater than a height of the support insulating film. The seed conductive film may cover the upper portion of the lower electrode extending from the trench. The support insulating film may be titanium oxide. The seed conductive film may be platinum and the ferroelectric film may be $SrTiO_3$, $BaTiO_3$, $(Ba,Sr)TiO_3$, $Pb(Zr,Ti)O_3$, $SrBi_2Ta_2O_9$, $(Pb,La)(Zr,Ti)O_3$ and/or $Bi_4Ti_3O_{12}$.

In other embodiments of the present invention, the ferroelectric capacitor includes an insulating film between the support insulating film and the substrate and a contact plug extending through the insulating film and electrically connecting the lower electrode to an active region of the integrated circuit substrate. The lower electrode may be a multilayer structure including a lower noble metal layer and an upper noble metal layer with a conductive oxide layer of the lower noble metal therebetween. The lower noble metal layer and the conductive oxide layer may be conformal to the sidewalls and the bottom surface of the trench and the upper noble metal layer may then fill portions of the trench not filled by the lower noble metal layer and the conductive oxide layer. The upper noble metal layer and the lower noble metal layer may be platinum, ruthenium, iridium, rhodium, osmium and/or palladium and the conductive oxide layer may be ruthenium dioxide and/or iridium dioxide.

Integrated circuit memory devices including ferroelectric capacitors of the present invention are also provided. The memory devices include a plurality of cells arranged in a cell array, ones of the cells including a ferroelectric capacitor according to embodiments of the present invention.

In further embodiments of the present invention, methods for forming a ferroelectric capacitor include forming a support insulating film on an integrated circuit substrate. The support insulating film is patterned to form a trench therein. A lower electrode is formed in the trench. A seed conductive film is formed covering the lower electrode. A ferroelectric film is formed on the support insulating film and the seed conductive film and an upper electrode is formed on the ferroelectric film. The ferroelectric film may extend over all of the seed conductive film and the support insulating film adjacent the seed conductive film.

In other embodiments of the present invention, forming the lower electrode includes forming a noble metal and/or a conductive oxide of the noble metal on sidewalls and a bottom surface of the trench and on the support insulating film to fill the trench and planarizing the formed noble metal and/or conductive oxide of the noble metal to expose the support insulating film. Patterning the support insulating film may be preceded by forming a planarization stop layer on the support insulating film. In such embodiments of the present invention, forming the lower electrode includes forming a noble metal and/or an oxide of the noble metal on the sidewalls and the bottom surface of the trench and on the planarization stop layer to fill the trench. The formed noble metal and/or conductive oxide of the noble metal are planarized to expose the planarization stop layer and the exposed planarization stop layer is removed. The planarization stop layer may be a material having an etch selectivity with respect to the lower electrode. For example, the planarization stop layer may be silicon nitride.

In further embodiments of the present invention, forming the seed conductive film includes forming a seed conductive material on the patterned support insulating film and on the lower electrode and patterning the seed conductive material to expose portions of the support insulating film while leaving seed conductive material covering the lower electrode.

In other embodiments of the present invention, forming the lower electrode includes forming a noble metal and/or a conductive oxide of the noble metal on sidewalls and a bottom surface of the trench and on the support insulating film. A sacrificial oxide film is formed on the formed noble metal and/or conductive oxide to fill the trench. The formed sacrificial oxide film is planarized to expose the support insulating film. The sacrificial oxide film is removed.

In further embodiments of the present invention, forming the lower electrode includes conformally forming a lower noble metal on sidewalls and a bottom surface of the trench and on the support insulating film and conformally forming a conductive oxide of the lower noble metal on the lower noble metal. An upper noble metal is formed on the conductive oxide to fill the trench and the formed upper noble metal is planarized to expose the support insulating film. The upper noble metal and the lower noble metal may be platinum, ruthenium, iridium, rhodium, osmium and/or palladium and the conductive oxide may be ruthenium dioxide and/or iridium dioxide. The seed conductive film and the upper noble metal may be platinum and the support insulating film may be titanium oxide. The lower noble metal may be iridium and the conductive oxide may be iridium oxide.

In other embodiments of the present invention, methods for forming a ferroelectric capacitor include forming a support insulating film on an integrated circuit substrate and a planarization stop layer on the support insulating film. The planarization stop layer and the support insulating film are patterned to form a trench therein. A lower electrode film is formed on sidewalls and a bottom surface of the trench and on the planarization stop layer to fill the trench. The resultant substrate is planarized until the planarization stop layer is exposed, to form a lower electrode separated in a cell unit. The exposed planarization stop layer is removed. A seed conductive film is formed covering the exposed lower electrode. A ferroelectric film is formed on an entire surface of the support insulating film and on the seed conductive film and an upper electrode is formed on the ferroelectric film.

In further embodiments of the present invention, forming the lower electrode film includes conformally forming iridium and iridium dioxide on the sidewalls and the bottom surface of the trench and on the planarization stop layer and forming platinum on the iridium dioxide to fully fill the trench. Forming the seed conductive film includes forming a seed conductive material on the support insulating film and on a protruded portion of the lower electrode and patterning the seed conductive material to allow the seed conductive material to cover the lower electrode. The planarization stop layer may be formed of silicon nitride, the support insulating film may be formed of titanium oxide, the seed conductive film may be formed of platinum and the ferroelectric film may be formed of $Pb(Zr,Ti)O_3$.

In other embodiments of the present invention, ferroelectric capacitors include a lower electrode buried in a support insulating film and a seed conductive film covering a surface of the exposed lower electrode. The lower electrode is characterized in it is fully covered with the support insulating film and the seed conductive film. Also, a ferroelectric film is arranged on an entire surface of the support insulating film and the seed conductive film.

In further embodiments of the present invention, ferrroelectric capacitors include a support insulating film formed over a semiconductor substrate and having a trench therein, a lower electrode formed on sidewalls and a bottom surface of the trench to fill the trench, a seed conductive film covering the lower electrode, a ferroelectric film formed on an entire surface of the support insulating film and the seed conductive film and an upper electrode formed on the ferroelectric film. The support insulating film may be formed of silicon oxide, preferably, of a stable material that does not react with the ferroelectric film, for instance, of titanium oxide. Alternatively, the support insulating film is formed of a combination of the aforementioned materials. In case of such a combination, the titanium oxide may be in contact with the ferroelectric film.

In other embodiments of the present invention, the ferroelectric film is formed of a material having a remnant polarization state with respect to an electric field applied from an external. The ferroelectric film may have a property depending on a property of a film formed therebeneath. Accordingly, the seed conductive film may be formed of a conductive film allowing the ferroelectric film arranged thereon to be formed with a superior ferroelectric characteristic. In some embodiments, the seed conductive film is formed of platinum.

In further embodiments of the present invention, the lower electrode is arranged inside a trench formed penetrating the insulating film. The lower electrode can be formed of a material selected from a group consisting of a noble metal, a conductive oxide of the noble metal and a combination thereof. For instance, the noble metal may include a material selected from the group consisting of platinum, ruthenium, iridium, rhodium, osmium, palladium and the like. The conductive oxide of the noble metal, for example, may be iridium dioxide, ruthenium dioxide and/or the like. However, other materials may be used in other embodiments of the present invention.

In some embodiments of the present invention, the lower electrode is iridium and iridium dioxide conformally arranged on the sidewalls and the bottom of the trench and platinum arranged on the iridium dioxide to fill the trench. In such embodiments, the seed conductive film may be platinum. In other embodiments of the present invention, iridium and iridium dioxide are replaced by a noble metal, such as ruthenium, osmium or the like, and a conductive oxide of the precious metal. As used herein, "conformally" refers to forming of an arbitrary film with a substantially uniform thickness on the underlying film and along the contour of the underlying film.

In other embodiments of the present invention, the platinum filling of the trench may not be formed. In such embodiments, the aforementioned noble metal may be conformally arranged on the sidewalls and bottom of the trench and the conductive oxide of the noble metal may be arranged to fully fill the trench to constitute the lower electrode. Also, the noble metal and the conductive oxide thereof may be conformally arranged on the sidewalls and bottom of the trench to constitute the lower electrode of dual films and the seed conductive film may cover the exposed surface of the lower electrode of dual films and at the same time fully fill the trench.

Platinum filling the trench may be replaced by filling with another noble metal. The noble metal conformally formed on the sidewalls and bottom of the trench, for instance, iridium, ruthenium or the like, may serve as the oxidation stop layer. Instead of iridium and ruthenium, an oxidation stop layer of TiAlN, TiN or the like may be used. The oxide of the noble metal may serve to enhance the fatigue characteristic of the ferroelectric film. In other words, the oxide of the noble metal may compensate for deterioration of the ferroelectric film due to repeated read and write operations of the ferroelectric memory device, for instance, oxygen deficiency.

In further embodiments of the present invention, methods for forming a ferroelectric capacitor include forming a trench in a support insulating film, filling the trench with a conductive material and forming a seed conductive film to cover an exposed surface of the lower electrode. In other words, an etch process for the ferroelectric film is not performed and the ferroelectric film is formed after the lower electrode is formed completely. Accordingly, the ferroelectric film may not be subject to etch damage and may not be exposed to an etch gas atmosphere and a reliable ferroelectric film may be formed.

In other embodiments of the present invention, methods for forming a ferroelectric capacitor include forming a support insulating film on a semiconductor substrate, patterning the support insulating film to form a trench therein, forming a lower electrode in the trench, forming a seed conductive film covering the lower electrode, forming a ferroelectric film on an entire surface of the support insulating film and on the seed conductive film and forming an upper electrode on the ferroelectric film. Alternatively, the method may further include forming an oxidation stop layer on the sidewalls and bottom of the trench. The oxidation stop layer may be formed of iridium, ruthenium, TiAlN, TiN or the like.

Forming the lower electrode may include forming a noble metal, a conductive oxide of the noble metal and/or a combination thereof on sidewalls and a bottom surface of the trench and on the support insulating film to fill the trench and planarizing the resultant substrate until the support insulating film is exposed. Forming the lower electrode may include forming a noble metal, a conductive oxide of the noble metal and/or a combination thereof on sidewalls and a bottom surface of the trench and on the support insulating film, forming a sacrificial oxide film on the resultant substrate to fully fill the trench, planarizing the resultant substrate until the support insulating film is exposed and removing the remaining sacrificial insulating film from the resultant substrate.

In some embodiments of the present invention, forming the seed conductive film includes forming a seed conductive material on the support insulating film exposed and on the lower electrode and patterning the seed conductive material to allow the seed conductive material to cover the lower electrode. In order to enhance a process margin of the planarizing step, a planarization stop layer may be formed on the support insulating film. In such embodiments of the present invention, after the planarization step, the planarization stop layer may be removed. Accordingly, the lower electrode may protrude from the surface of the support insulating film by the thickness of the planarization stop layer. The support insulating film may be formed of silicon oxide or titanium oxide. The planarization stop layer may be formed of a material having an etch selectivity with respect to the lower electrode, for instance, silicon nitride.

In further embodiments of the present invention, methods for forming a ferroelectric capacitor include forming a support insulating film over a semiconductor substrate, forming a planarization stop layer on the support insulating film, patterning the planarization stop layer and the support insulating film to form a trench therein, forming a lower electrode film on sidewalls and a bottom surface of the trench and on the planarization stop layer to fill the trench, planarizing the resultant substrate until the planarization stop layer is exposed to form a lower electrode separated in a cell unit, removing the exposed planarization stop layer, forming a seed conductive film covering the exposed lower electrode, forming a ferroelectric film on an entire surface of the support insulating film and on the seed conductive film and forming an upper electrode on the ferroelectric film.

Forming the lower electrode film may include sequentially forming iridium, iridium dioxide and platinum films on sidewalls and bottom of the trench and on the planarization stop layer. Forming the seed conductive film may include forming the seed conductive material on the support insulating film and on the protruded portion of the lower electrode and patterning the seed conductive material to allow the seed conductive material to cover the lower electrode. The planarization stop layer may be formed of silicon nitride, the support insulating film may be formed of titanium oxide, the seed conductive film may be formed of platinum and the ferroelectric film may be formed of $Pb(Zr, Ti)O_3$.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
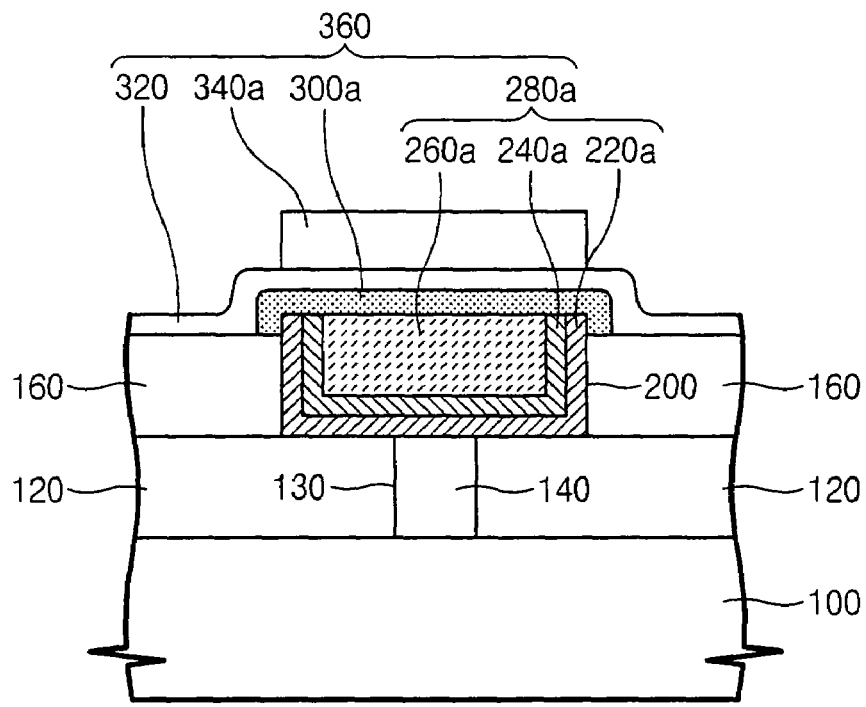
FIG. 1 is a cross-sectional view plane view diagram illustrating a ferroelectric capacitor according to some embodiments of the present invention.

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Integrated circuit devices and methods for forming such devices in accordance with embodiments of the present invention will now be described with reference to the FIG. 1. FIG. 1 is a cross-sectional view illustrating a ferroelectric capacitor 360 according to some embodiments of the present invention. As shown in FIG. 1, the ferroelectric capacitor 360 includes a sequentially stacked lower electrode 280a, a seed conductive film 300a, a ferroelectric film 320 and an upper electrode 340a over an integrated circuit (semiconductor) substrate 100. The lower electrode 280a of the ferroelectric capacitor 360 is electrically connected to an active region of the integrated circuit substrate 100 through a contact plug 140. The contact plug 140 may be formed by forming a contact hole 130 in an insulating film 120 formed on the integrated circuit substrate 100 and filling the contact hole 130 with a conductive material 140. However, the lower electrode 280a may also be electrically connected by other known means to the active region of the integrated circuit substrate 100.

A trench 200 is provided in a support insulating film 160 formed on the insulating film 120 and is filled with the lower electrode 280a. The trench 200 allows an upper surface of the contact plug 140 and a portion of the insulating film 120 adjacent thereto to be exposed.

As shown in the embodiments of FIG. 1, an upper surface of the lower electrode 280a is covered with the seed conductive film 300a. Thus, in some embodiments, the lower electrode 280a may be entirely enclosed by the support insulating film 160 and the seed conductive film 300a. The ferroelectric film 320 is formed on the seed conductive film 300a and the support insulating film 160 and the upper electrode 340a is formed on the ferroelectric film 320. As a result, an effective contact area of the ferroelectric film 320 can be increased. The ferroelectric film 320 can be formed, for example, from $SrTiO_3$, $BaTiO_3$, $(Ba,Sr)TiO_3$, $Pb(Zr,Ti)O_3$, $SrBi_2Ta_2O_9$, $(Pb,La)(Zr,Ti)O_3$ and/or $Bi_4Ti_3O_{12}$ and the like.

As shown for the embodiments of ferroelectric capacitors of the present invention in FIG. 1, the ferroelectric film 320 is in direct contact with the seed conductive film 300a and the support insulating film 160 and is not in direct contact with the lower electrode 280a. Thus, the ferroelectric film 320 may not be affected by the material used to form the lower electrode 280a on the trench 200. Also, the ferroelectric film 320 may retain an excellent film property for the seed conductive film 300a and the support insulating film 160. In some embodiments of the present invention, the seed conductive film 300a is formed of platinum, and the support insulating film 160 is formed of titanium oxide. Platinum and titanium oxide may permit the overlying ferroelectric film 320 to be stably formed thereon while retaining the excellent film property.

The ferroelectric capacitor according to embodiments of the present invention may allow the lower electrode 280a to be formed on the trench 200 in various configurations. For example, the lower electrode 280a can be formed of a noble metal, a conductive oxide of the noble metal and/or a combination thereof. Exemplary noble metals include platinum (Pt), ruthenium (Ru), iridium (Ir), rhodium (Rh), osmium (Oh), palladium (Pd) and the like. The conductive oxide of the noble metal may be iridium dioxide, ruthenium dioxide and/or the like.

In some embodiments of the present invention, as shown in FIG. 1, the lower electrode 280a includes the lower noble metal 220a, a conductive oxide 240a of the lower noble metal, and an upper noble metal 260a. The lower noble metal 220a and a conductive oxide 240a thereof may be sequentially formed on sidewalls and a bottom surface of the trench 200 to a configuration that conforms to the trench 200. As used herein, "conformally" (or "conformity configuration" or "conforming configuration") refers to forming of a film with a substantially uniform thickness on an underlying film or structure and along the contour of the underlying film or structure.

The upper noble metal 260a illustrated in FIG. 1 is formed on the underlying conductive oxide 240a to fully fill the trench 200 non-conformally (non-conformity configuration) to the trench. It will be understood that an oxidation stop layer or the like may also be formed between the lower noble metal 220a and the trench 200. In particular embodiments of the present invention, the upper noble metal 260a is formed of platinum. The upper platinum 260a in addition to the seed platinum film 300a may allow the overlying ferroelectric film 320 to be formed thereon more stably.

In embodiments where the upper precious metal 260a is not used, the seed conductive film 300a instead of the upper precious metal 260a can be formed on the underlying conductive oxide 240a to fully fill the trench 200 non-conformally to the trench. In further embodiments of the present invention, the conductive oxide 240a rather than the upper precious metal 260a can be formed on the underlying lower precious metal 220a to fully fill the trench 200 non-conformally to the trench (i.e., not uniform thickness). In either case, the seed conductive film 300a covers the exposed surface of the lower electrode 280a.

While only a single electrode is described above, it is to be understood that in integrated circuit devices, such as a memory device, the lower electrode 280a may be regularly arrayed in a cell array region of the integrated circuit substrate 100 and electrically insulated from adjacent elements by the support insulating film 160.

As shown in the above structure of FIG. 1, the ferroelectric film 320 is separated from the lower electrode 280a by interposing the seed conductive film 300a therebetween. That is, the seed conductive film 300a is interposed between the ferroelectric film 320 and the lower electrode 280a so that the ferroelectric film 320 is not in direct contact with the lower electrode 280a. The ferroelectric film 320 is shown as being in direct contact with the seed conductive film 300a and the support insulating film 160. In such a configuration, appropriate arrangement of the seed conductive film 300a and the support insulating film 160 can improve the regularity and the film property of the ferroelectric film 320 depending upon the underlying film.

The lower electrode 280a can be formed using a sputtering process, a Low Pressured Chemical Vapor Deposition (LP-CVD) process, a Plasma Enhanced Chemical Vapor Deposition (PE-CVD) process and/or an Atomic Layer Deposition (ALD) process. Similarly, the upper electrode 340a can be also formed of the same material and using the same process as the lower electrode 280a.

Figure 2:
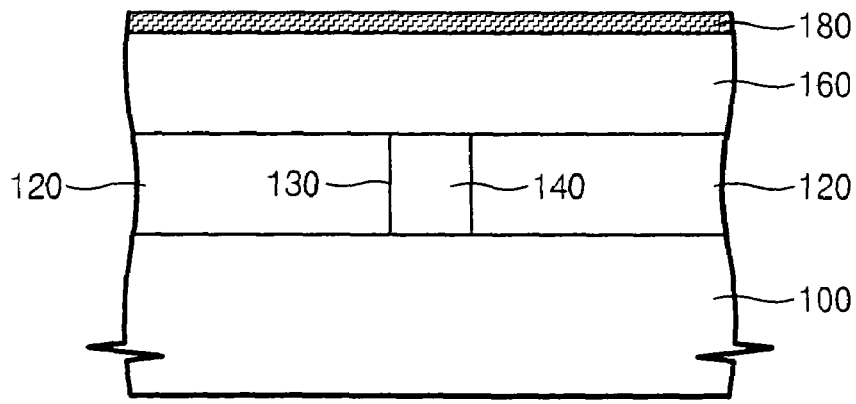
FIGS. 2 to 9 are cross-sectional and plane views illustrating methods for fabricating a ferroelectric capacitor according to some embodiments of the present invention.

Embodiments of methods of forming a ferroelectric capacitor according to the present invention will now be described with reference to FIGS. 2 to 9. Referring now to FIG. 2, an active region and a device isolation region are defined in the integrated circuit substrate 100, for example, using a general isolation process. After a gate electrode and a bit line are formed, the insulating film 120 is formed thereon. For example, the insulating film 120 may be formed of silicon oxide using conventional methods. The formed insulating film 120 is patterned to form a contact hole 130 therein that exposes the active region of the integrated circuit substrate 100. The active region may be, for example, a source region formed in the integrated circuit substrate 100 and at one side of the gate electrode. In such a memory cell arrangement, the bit line may be electrically connected to a drain region formed in the integrated circuit substrate 100 proximate another side of the gate electrode.

After a conductive plug material is formed on the insulating film 120 to fill the contact hole 130, a contact plug 140 is formed using, for example, a planarization process. The contact plug 140 may be formed, for example, from polysilicon, tungsten and/or the like.

The support insulating film 160 and the planarization stop layer 180 are sequentially formed on the contact plug 140 and the insulating film 120. The planarization stop layer 180 may be provided as an etching stopping layer and may improve a process margin in a subsequent planarization process. However, it will be understood that the planarization stop layer 180 may not be used in various embodiments of the present invention. The support insulating film 160 can be formed of silicon oxide. In various embodiments of the present invention, the support insulating film 160 is formed of a stable material, such as titanium oxide, having substantially no reaction with the subsequently formed overlying ferroelectric film. In other embodiments of the present invention, the support insulating film is formed of a combination of silicon oxide and titanium oxide. In such embodiments, the titanium oxide may contact the ferroelectric film 320.

The planarization stop layer 180 may be formed of material having an etch selection ratio with respect to the overlying lower electrode formed in the subsequent process. For example, the planarization stop layer 180 may be silicon nitride.

Figure 3:
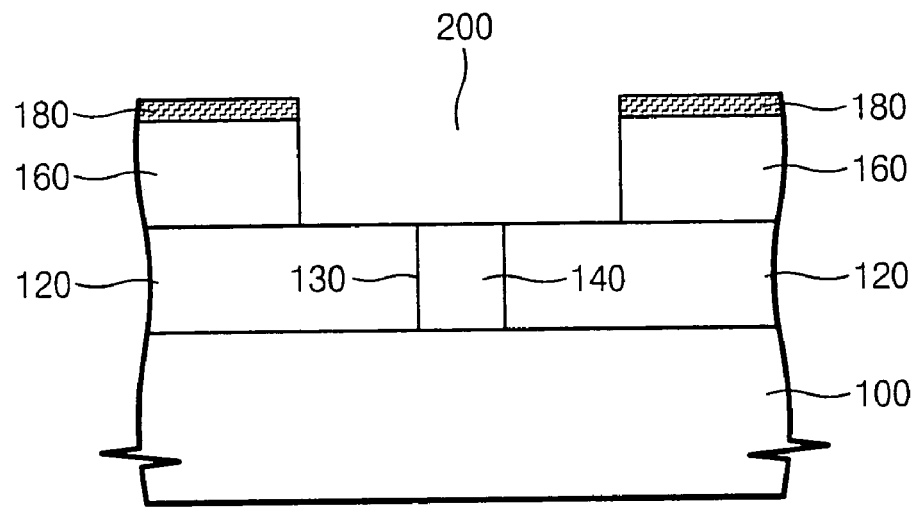

Referring now to FIG. 3, the planarization stop layer 180 and the underlying support insulating film 160 are patterned to form the trench 200 therein to expose the contact plug 140 and a portion of the insulating film adjacent thereto. The trench 200 is provided to define the lower electrode. Embodiments of processes for forming the lower electrode will now be described. For the exemplary lower electrode illustrated in FIGS. 4–9, the lower electrode is formed from a multi-layer (three layer) film of iridium, iridium dioxide and platinum. As described above, the lower electrode can, however, have various other configurations as will be understood by those of skill in the art.

Figure 4:
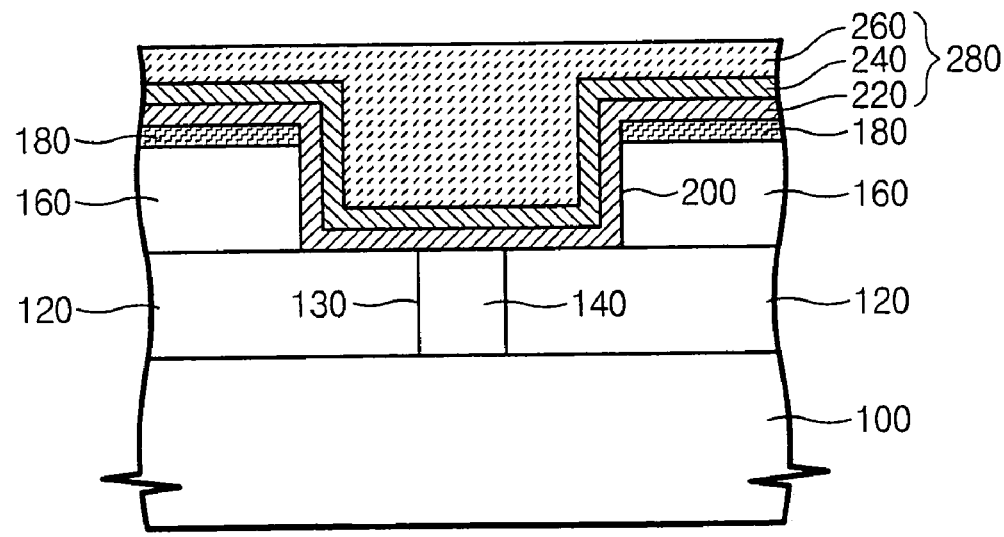

As shown in FIG. 4, the lower electrode materials 280 are formed to fill the trench 200. In particular, iridium 220 and iridium dioxide 240 are sequentially formed on the sidewalls and the bottom surface of the trench 200 and on the planarization stop layer 180 conformally to the trench. Platinum 260 is formed on the underlying iridium dioxide 240 to fully fill the trench 200. The iridium 220 is provided as an oxidation stop layer for preventing and/or limiting any reaction between the platinum 260 and the contact plug 140. The iridium dioxide 240 is provided as it may improve a fatigue property of the ferroelectric film. In other embodiments of the present invention including a three layer lower electrode, the lower electrode is a three layer film of ruthenium, ruthenium dioxide and platinum. In such embodiments, the ruthenium may function as a barrier film and the ruthenium dioxide may improve the fatigue property of the ferroelectric film.

Figure 5A:
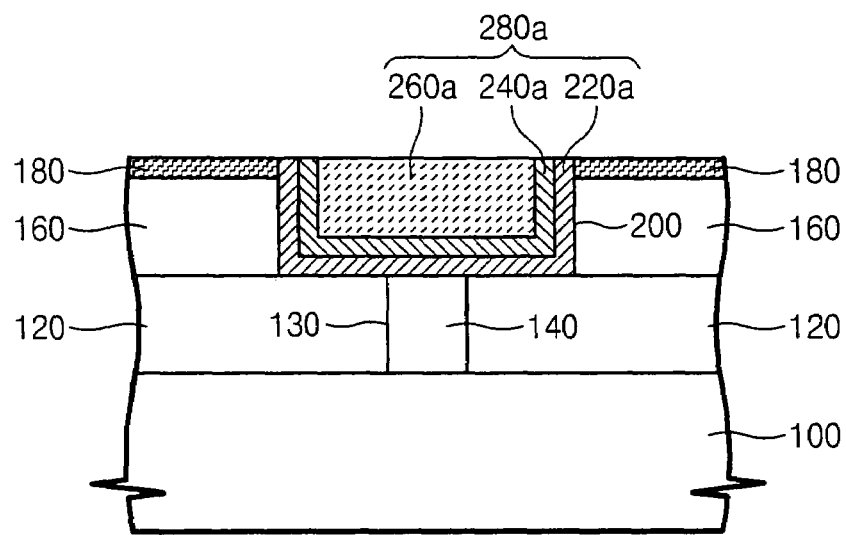
Figure 5B:
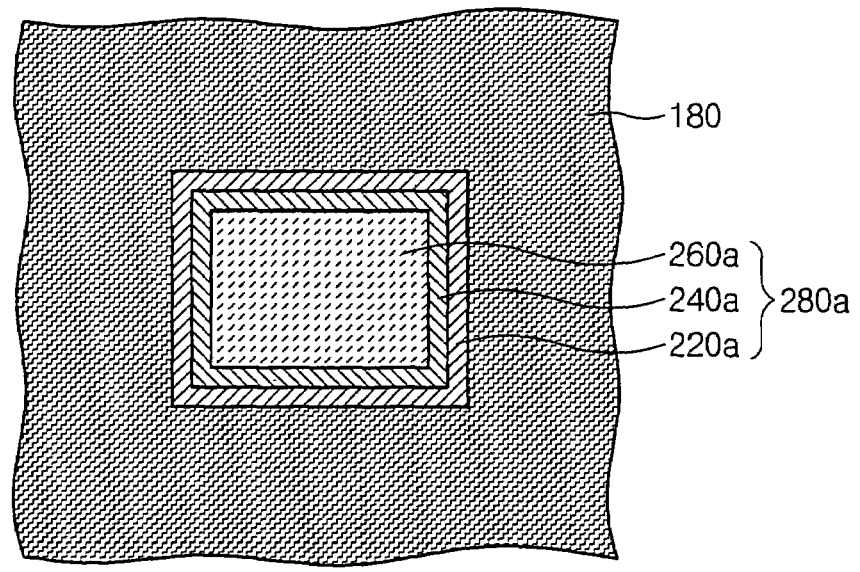

Referring now to FIG. 5A, the lower electrode films 280 are planarized until the planarization stop layer 180 is externally exposed. As a result, the lower electrode films 220a, 240a and 260a remain only in the trench 200, which may allow the lower electrode 280a to be electrically disconnected from adjacent lower electrodes. For example, a chemical mechanical polishing (CMP) process or etchback process may be used for the planarization process. As shown in FIG. 5B (corresponding planar view of FIG. 5A), where the trench 200 has a rectangular configuration, platinum 260a remains in the trench 200 in a rectangular pillar configuration, iridium dioxide 240a encircles the platinum 260a and the iridium 220a encircles the iridium dioxide 240a and contacts the sidewalls of the trench 200. As such, when the lower electrode 280a is externally exposed by the planarization process with the platinum 260a shaped as a rectangular, the iridium dioxide 240a shaped as a rectangular belt encircling the rectangular platinum 260a, and the iridium 220a shaped as a rectangular belt encircling the iridium dioxide 240a.

Figure 6A:
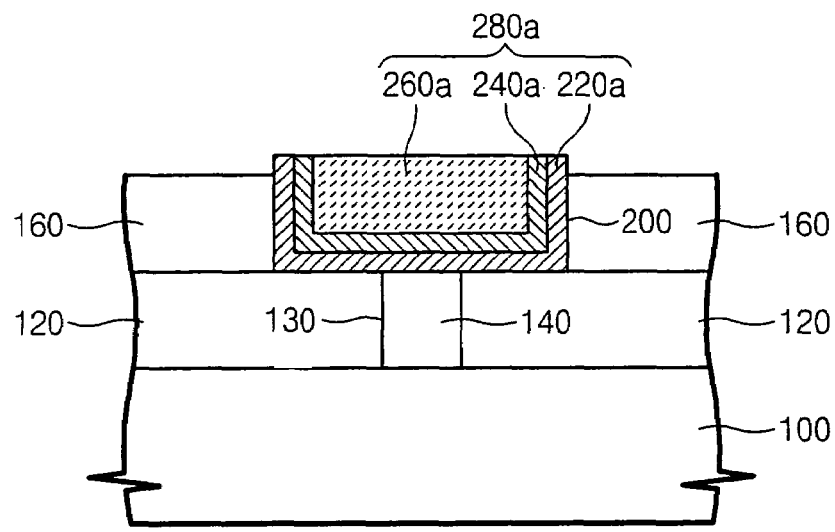
Figure 6B:
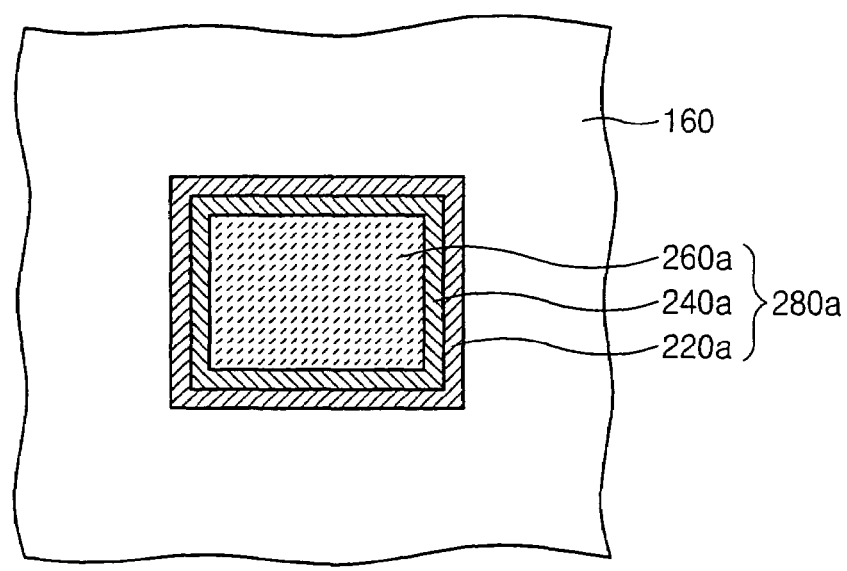

As shown in FIG. 6A, the exposed planarization stop layer 180 is removed from the substrate to externally expose the support insulating film 160. Where the planarization stop layer 180 is formed of silicon nitride, the silicon nitride may be removed using, for example, a phosphate solution. As a result of the removal of the planarization stop layer 180, the lower electrode 280a protrudes over (to a greater height as shown in FIG. 6A) the support insulating film 160 by about the thickness of the removed planarization stop layer 180. Referring to FIG. 6B, which is a planar view corresponding to FIG. 6A, it is seen that the support insulating film 160 is externally exposed by the removal of the planarization stop layer 180.

Figure 7A:
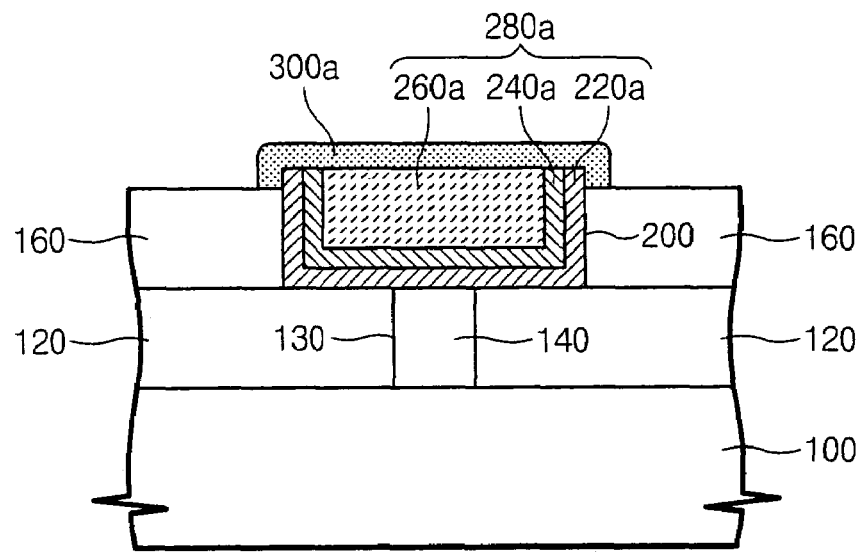

Referring now to FIG. 7A, the seed conductive film 300a is formed on the underlying exposed lower electrode 280a, in particular, on an upper surface of the lower electrode 280a and on an upper sidewall of the underlying lower electrode 280a that was exposed by removing the planarization stop layer 180. After the conductive material is deposited on the support insulating film 160 and the exposed lower electrode 280a, the conductive material is patterned to form the seed conductive film 300a covering the underlying lower electrode 280a through, for example, photolithography.

The seed conductive film 300a may be formed of material selected to facilitate deposition of the overlying ferroelectric film thereon, to provide, for example, improved adhesion of the ferroelectric film. For example, the seed conductive film 300a may be platinum. Accordingly, as used herein, a "seed conductive" film refers to a film that serves as a seeding layer for growing a ferroelectric film to have a desired polarization characteristic. For example, the seed conductive film may be a seeding layer that can provide a crystal lattice (e.g., [111] direction) such that the ferroelectric film grows along the crystal lattice ([111] direction) to provide a desireable polarization characteristic.

Figure 7B:
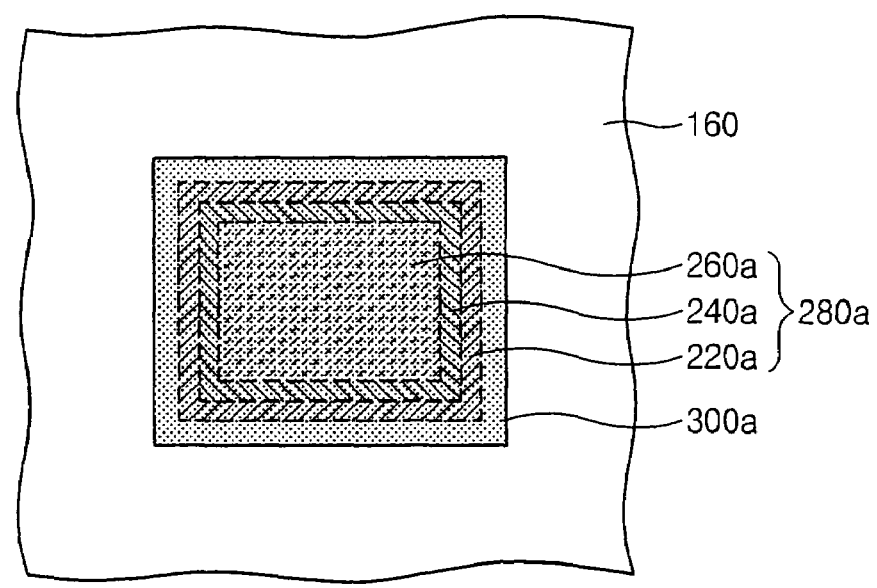

Referring to FIG. 7B, which is a planar view corresponding to FIG. 7A, as a result of forming the seed conductive film 300a, the lower electrode 280a is entirely encircled/enclosed by the support insulating film 160 and the seed conductive film 300a.

Figure 8:
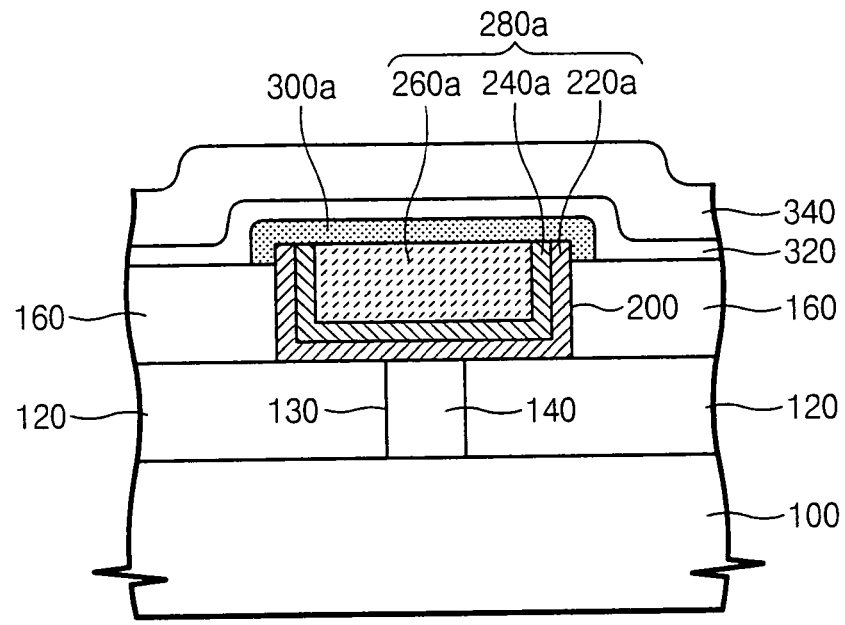
Figure 9:
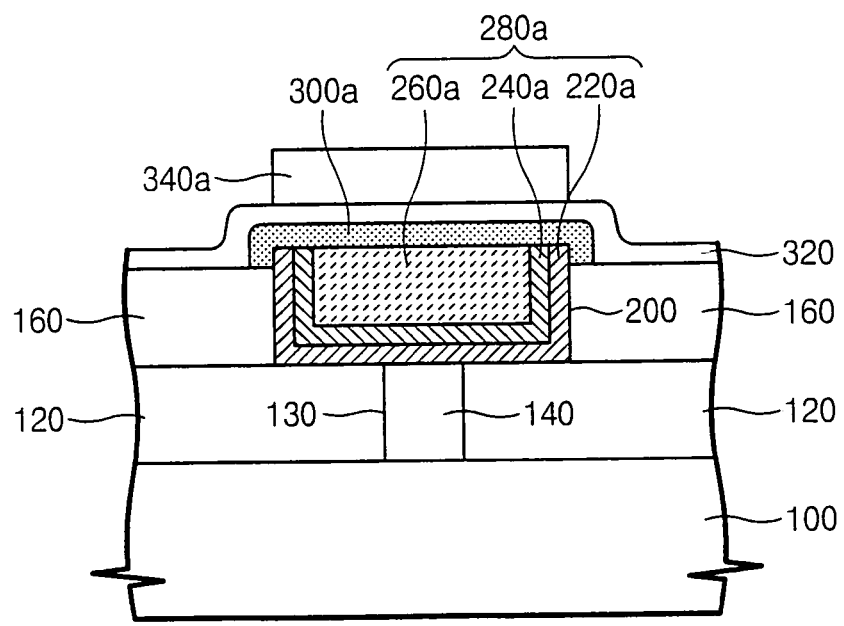

Referring now to FIG. 8, the ferroelectric film 320 is formed on the support insulating film 160 and the seed conductive film 300a. The ferroelectric film 320 is formed of material having a remnant polarization that may be set to a stabile state by application of an electric field. The ferroelectric film 320 can be formed, for example, from $SrTiO_3$, $BaTiO_3$, $(Ba,Sr)TiO_3$, $Pb(Zr,Ti)O_3$, $SrBi_2Ta_2O_9$, $(Pb,La)(Zr, Ti)O_3$ and/or $Bi_4Ti_3O_{12}$ and the like. The ferroelectric film 320 may be formed, for example, using a sol-gel process, a CVD process, a sputtering process, an ALD process and/or the like. The upper electrode material 340 may be formed on the underlying ferroelectric film 320 without subjecting the ferroelectric film 320 to a separate etching process, in other words, without etching to separate the ferroelectric film 320 for a particular cell unit of, for example, a memory array including the ferroelectric capacitor. The upper electrode material 340 may, but need not, be formed from the same material and in the same manner process the lower electrode 280a. As shown in FIG. 9, the upper electrode 340a is formed by patterning the upper electrode material 340.

For the method for fabricating a ferroelectric capacitor illustrated in FIGS. 2–9, as the ferroelectric film 320 is formed after the lower electrode 280a and the seed conductive film 300a are completed, the ferroelectric film 320 need not be exposed to an etching atmosphere during etching of the lower electrode 280a and the seed conductive film 300a. Furthermore, as the ferroelectric film 320 need not be subjected to the etching process used for separating the ferroelectric film 320 to define different cell units, the ferroelectric film 320 may not be subjected to damage during such an etching process.

Operations for fabricating a ferroelectric capacitor according to further embodiments of the present invention will now be described with reference to FIGS. 10 to 14. As contrasted with the embodiment shown in FIGS. 2 to 9, the operations illustrated in FIGS. 10 to 14 are characterized in that the seed conductive film only partially fills the trench and the lower electrode is a two-layer film having a noble metal and a conductive oxide thereof. Therefore, aspects of the embodiments illustrated in FIGS. 10 to 14 that correspond to those previously described will not be described in detail with reference to FIGS. 10 to 14.

Figure 10:
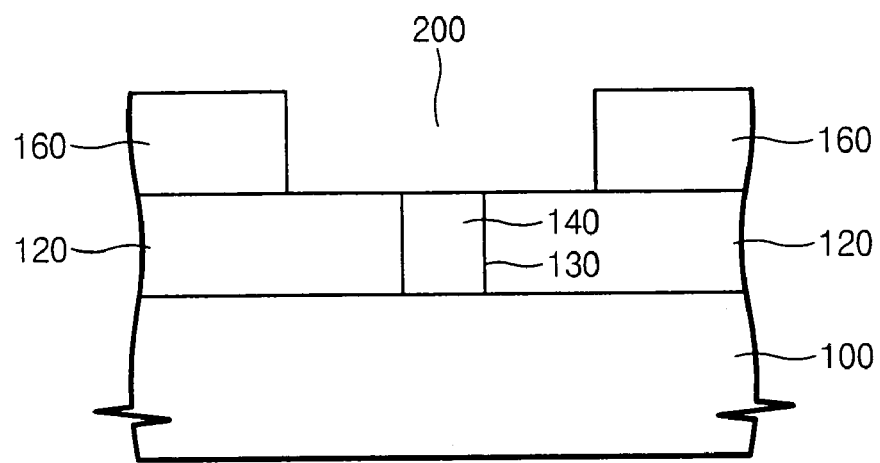
FIGS. 10 to 14 are cross-sectional views illustrating methods for fabricating a ferroelectric capacitor according to further embodiments of the present invention.

As shown in FIG. 10, similarly to the operations described above with reference to FIGS. 2 and 3, the insulating film 120, the contact hole 130 and the contact plug 140 are formed on the integrated circuit substrate 100. The support insulating film 160 is formed on the underlying insulating film 120. The support insulating film 160 may be formed of titanium oxide. In embodiments where the support insulating film 160 is formed of silicon oxide, a silicon nitride film may also be formed as a planarization stop layer on the support insulating film 160. Similarly, in embodiments where the support insulating film 160 is formed of titanium oxide, a planarization stop layer can also be formed on the support insulating film 160.

Figure 11:
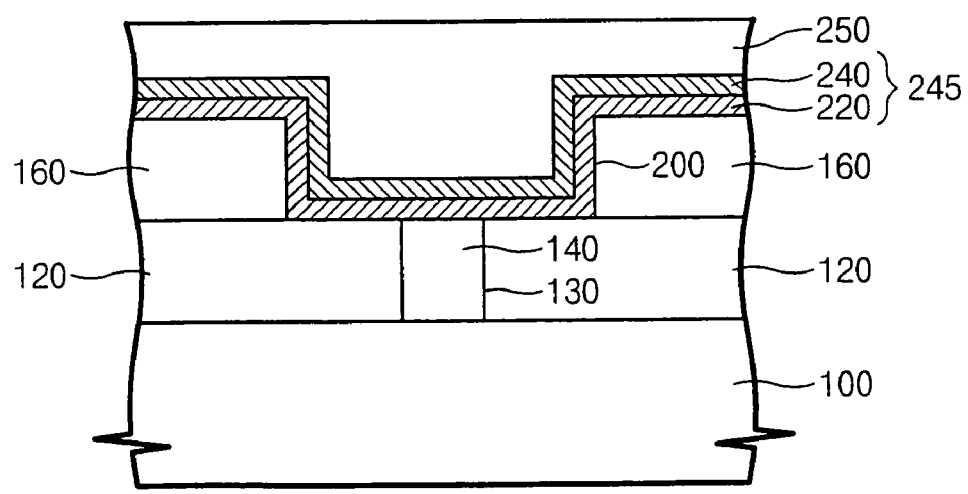

Referring now to FIG. 11, the lower electrode material 245 is formed on the sidewalls and the bottom surface of the trench 200 and on the support insulating film 160 conformally to the trench 200. A sacrificial oxide film 250 is formed non-conformally on the lower electrode material 245 to fully fill the trench 200. The lower electrode material 245 may be, for example, a noble metal, the conductive oxide of the noble metal and/or a combination thereof. In some embodiments of the present invention, the lower electrode material 245 is a dual film of sequentially stacked iridium 220 and iridium dioxide 240 or a dual film of sequentially stacked ruthenium 220 and ruthenium dioxide 240. An oxidation stop layer can also be formed before the lower electrode material 245 is formed.

Figure 12:
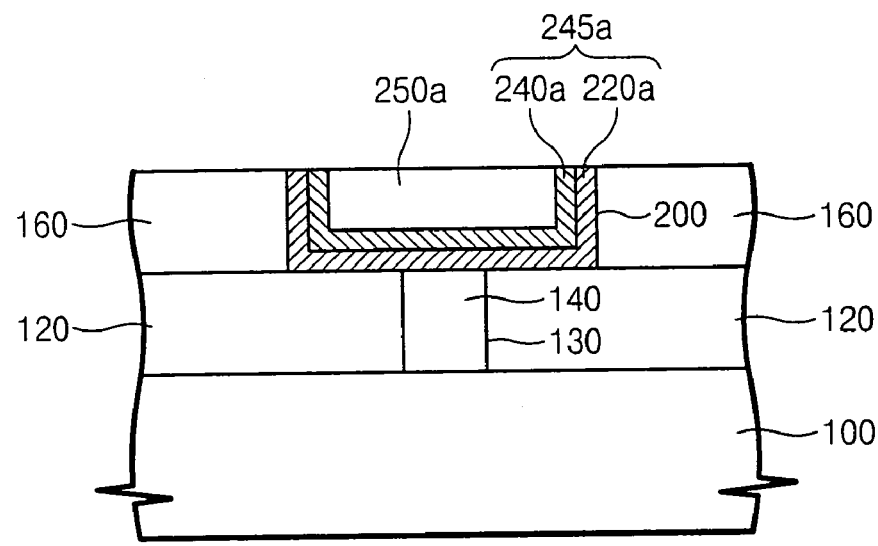

As shown in FIG. 12, the substrate of FIG. 11 is planarized until the upper surface of the support insulating film 160 is exposed, so that the lower electrode material 245 remains only in the trench 200 to separate the lower electrode 245a from other cell units of an integrated circuit device including the ferroelectric capacitor. The planarization process may be, for example, an etch-back process or a CMP process.

Figure 13:
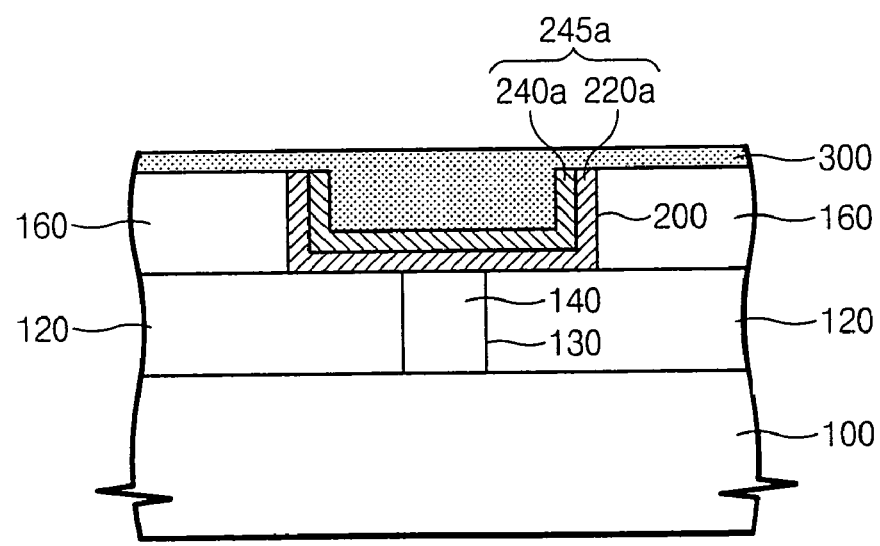
Figure 14:
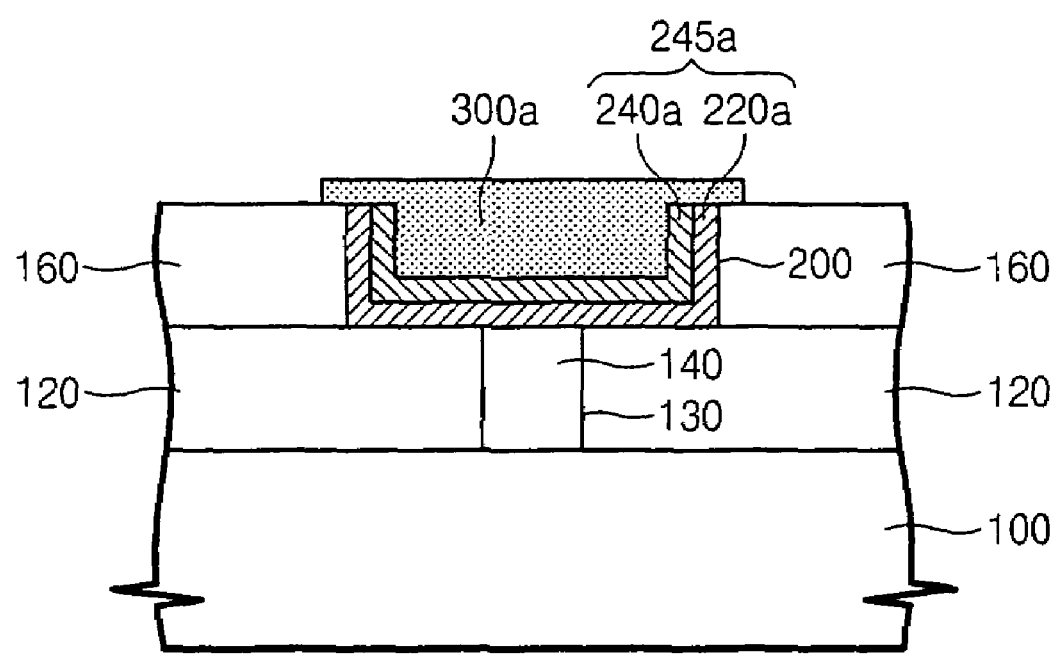

Referring now to FIG. 13, after the remaining sacrificial oxide film 250a is removed from the trench 200, the seed conductive material 300 is formed on the lower electrode 245a and on the support insulating film 160. As a result, the seed conductive material 300 fully fills the trench 200 to cover the exposed surface of the lower electrode 245a. Thus, as contrasted with the embodiments of FIGS. 2–9, the seed conductive material 300 is formed extending inside the trench 200. The seed conductive material 300 may be, for example, platinum or another noble metal. As shown in FIG. 14, the seed conductive material 300 is patterned to form the seed conductive film 300a covering the underlying lower electrode 245a. Thus, the lower electrode 245a is entirely encircled by the seed conductive film 300a and the support insulating film 160. It will be understood that the structure of FIG. 14 may further be covered by additional structures as illustrated, for example, in FIGS. 8–9.

As described above, a ferroelectric capacitor according to some embodiments of the present invention includes a lower electrode filling a trench formed in an underlying support insulating film and a seed conductive film covering the underlying lower electrode. As a result, the lower electrode may be encircled by the support insulating film and covered with the seed conductive film. The film property of a ferroelectric film may thereby be improved as the ferroelectric film is formed on the underlying seed conductive film and support insulating film covering the lower electrode. In addition, as the ferroelectric film is formed after the lower electrode and the seed conductive film are completed, the ferroelectric film may not be subjected to a subsequent etching process and the ferroelectric film may not be exposed to the etching atmosphere or subjected to damage during the etching process. The resulting ferroelectric film may be formed to have an improved film property and increased effective contact area.

It should be noted that many variations and modifications may be made to the embodiments described above without substantially departing from the principles of the present invention. All such variations and modifications are intended to be included herein within the scope of the present invention, as set forth in the following claims.

We claim:
1. A ferroelectric capacitor comprising:
a support insulating film on an integrated circuit substrate and having a trench therein;
a lower electrode on sidewalls and a bottom surface of the trench;

a seed conductive film on the lower electrode and extending on the support insulating film beyond the lower electrode and contacting the support insulating film;

a ferroelectric film on the support insulating film and the seed conductive film; and an upper electrode on the ferroelectric film.

2. The ferroelectric capacitor of claim 1 wherein the lower electrode fills the trench and wherein the ferroelectric film extends over all of the seed conductive film and the support insulating film adjacent the seed conductive film.

3. The ferroelectric capacitor of claim 1 wherein the lower electrode includes an upper portion thereof extending from the trench to a height relative to the integrated circuit substrate greater than a height of the support insulating film and wherein the seed conductive film covers the upper portion of the lower electrode extending from the trench including covering a sidewall portion of the upper portion of the lower electrode extending from the trench.

4. The ferroelectric capacitor of claim 1, further comprising:
   an insulating film between the support insulating film and the substrate; and
   a contact plug extending through the insulating film and electrically connecting the lower electrode to an active region of the integrated circuit substrate.

5. The ferroelectric capacitor of claim 3 wherein the support insulating film comprises titanium oxide.

6. The ferroelectric capacitor of claim 1 wherein the seed conductive film comprises platinum and wherein the ferroelectric film comprises $SrTiO_3$, $BaTiO_3$, $(Ba,Sr)TiO_3$, $Pb(Zr,Ti)O_3$, $SrBi_2Ta_2O_9$, $(Pb,La)(Zr,Ti)O_3$ and/or $Bi_4Ti_3O_{12}$.

7. The ferroelectric capacitor of claim 1 wherein the lower electrode and the upper electrode comprise a noble metal and/or an oxide thereof.

8. The ferroelectric capacitor of claim 7 wherein the noble metal comprises platinum, ruthenium, iridium, rhodium, osmium and/or palladium.

9. An integrated circuit memory device having a plurality of cells arranged in a cell array, ones of the cells including the ferroelectric capacitor of claim 1.

10. A ferroelectric capacitor comprising:
    a support insulating film on an integrated circuit substrate and having a trench therein;
    a lower electrode on sidewalls and a bottom surface of the trench;
    a seed conductive film covering the lower electrode;
    a ferroelectric film on the support insulating film and the seed conductive film; and
    an upper electrode on the ferroelectric film;
    wherein the lower electrode comprises a multilayer structure including a lower noble metal layer and an upper noble metal layer with a conductive oxide layer of the lower noble metal therebetween and wherein the lower noble metal layer and the conductive oxide layer are conformal to the sidewalls and the bottom surface of the trench and the upper noble metal layer fills portions of the trench not filled by the lower noble metal layer and the conductive oxide layer.

11. The ferroelectric capacitor of claim 10 wherein the seed conductive film comprises platinum.

12. The ferroelectric capacitor of claim 10 wherein the upper noble metal layer and the lower noble metal layer comprise platinum, ruthenium, iridium, rhodium, osmium and/or palladium and wherein the conductive oxide layer comprises ruthenium dioxide and/or iridium dioxide.

13. The ferroelectric capacitor of claim 2 wherein the ferroelectric film extends over all of the seed conductive film and extends beyond the seed conductive film over a portion of the support insulating film adjacent the seed conductive film.

14. A ferroelectric capacitor comprising:
    a support insulating film on an integrated circuit substrate and having a trench therein;
    a lower electrode on sidewalls and a bottom surface of the trench and having an upper portion extending from the trench to a height relative to the integrated circuit substrate greater than a height of the support insulating film;
    a seed conductive film covering the upper portion of the lower electrode extending from the trench including covering a sidewall portion of the upper portion of the lower electrode extending from the trench;
    a ferroelectric film on the support insulating film and the seed conductive film; and
    an upper electrode on the ferroelectric film.

15. The ferroelectric capacitor of claim 14 wherein the lower electrode fills the trench and wherein the ferroelectric film extends over all of the seed conductive film and extends beyond the seed conductive film over a portion of the support insulating film adjacent the seed conductive film.

* * * * *